United States Patent
Choi

(10) Patent No.: US 7,923,335 B2
(45) Date of Patent: Apr. 12, 2011

(54) NON-VOLATILE MEMORY DEVICE AND MANUFACTURING METHOD THEREOF

(75) Inventor: Eun Seok Choi, Seongnam-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 224 days.

(21) Appl. No.: 12/276,210

(22) Filed: Nov. 21, 2008

(65) Prior Publication Data

US 2009/0081841 A1 Mar. 26, 2009

Related U.S. Application Data

(62) Division of application No. 11/635,910, filed on Dec. 8, 2006, now abandoned.

(30) Foreign Application Priority Data

Jun. 29, 2006 (KR) .................. 10-2006-0059757

(51) Int. Cl.
*H01L 21/336* (2006.01)
*H01L 21/8238* (2006.01)

(52) U.S. Cl. ............... 438/287; 438/216; 257/E21.423; 257/E21.409

(58) Field of Classification Search .......... 438/287, 438/216; 257/E21.423, E21.409
See application file for complete search history.

(56) References Cited

U.S. PATENT DOCUMENTS

| | | | |
|---|---|---|---|
| 5,768,192 A | 6/1998 | Eitan et al. |
| 6,639,271 B1 | 10/2003 | Zheng et al. |
| 7,060,560 B2 | 6/2006 | Wu et al. |
| 7,112,842 B2 | 9/2006 | Chae et al. |
| 7,208,365 B2 | 4/2007 | Chae et al. |

FOREIGN PATENT DOCUMENTS

| | | |
|---|---|---|
| CN | 1574361 | 2/2005 |
| JP | 2004-071877 | 3/2004 |
| JP | 200407187 | 3/2004 |
| KR | 10-2005-0040534 | 5/2005 |
| KR | 102005004053 | 5/2005 |

OTHER PUBLICATIONS

Translation of First Office Action for Chinese Application No. 200610168026.2, dated Nov. 7, 2008.

*Primary Examiner* — Luan C Thai
(74) *Attorney, Agent, or Firm* — Marshall, Gerstein & Borun LLP

(57) ABSTRACT

A non-volatile memory device having a Polysilicon Oxide Nitride Oxide Semiconductor (SONOS) structure in which a charge trap layer is separated physically in a horizontal direction, and a method of manufacturing the same. The charge trap layer that traps electric charges toward the source and the drain is physically divided. It can fundamentally prevent the charges at both sides from being moved mutually. It is therefore possible to prevent interference between charges at both sides although the cell size is reduced.

9 Claims, 2 Drawing Sheets

NON-VOLATILE MEMORY DEVICE AND MANUFACTURING METHOD THEREOF

CROSS-REFERENCE TO RELATED APPLICATIONS

This is a divisional of co-pending, commonly-assigned U.S. application Ser. No. 11/635,910 filed Dec. 8, 2006, which in turn claims the convention priority of Korean application 2006-59757 filed Jun. 29, 2006.

BACKGROUND OF THE INVENTION

The invention relates, in general, to non-volatile memory devices and, more particularly, to a non-volatile memory device having a Polysilicon Oxide Nitride Oxide Semiconductor (SONOS) structure in which a charge trap layer is separated physically horizontally and a method of manufacturing the same.

In recent years, Non-volatile Semiconductor Memories (NVSM) are largely classified into floating gate series and Metal Insulator Semiconductor (MIS) series in which two or more kinds of dielectric layers are laminated doubly or triply in terms of the process technology.

The floating gate series implement a memory characteristic by employing the potential well. A representative example of the floating gate series is an EPROM Tunnel Oxide (ETO) structure that has been widely used as flash Electrically Erasable Programmable Read Only Memory (EEPROM). The MIS series performs the memory function employing traps existing at the dielectric layer bulk, the dielectric layer dielectric layer interface, and the dielectric layer-semiconductor interface. A representative example of the MIS series is a Metal/Polysilicon Oxide Nitride Oxide Semiconductor (MONOS/SONOS) that has been widely used as flash EEPROM.

A difference between the SONOS and general flash memory is that in the general flash memory, charges are stored in the floating gate, whereas in the SONOS, charges are stored in the nitride layer in terms of the structure.

Furthermore, in the general flash memory, the floating gate is formed using polysilicon. Thus, if any one defect exists in polysilicon, the retention time of charge is significantly lowered. In contrast, in the SONOS, the nitride layer is used instead of polysilicon as described above. Accordingly, the sensitivity to defect in process is relatively small.

In addition, in the general flash memory, tunnel oxide having a thickness of about 70 Å is formed under the floating gate. There is a limit to the implementation of a low-voltage and high-speed operation. However, in SONOS, direct tunneling oxide is formed under the nitride layer. It is therefore possible to implement a memory device having a lower voltage, lower power and high-speed operation.

A conventional flash memory device having the SONOS structure will be described below with reference to FIG. 1.

Referring to FIG. 1, a tunnel oxide layer 11, a charge trap layer 12, a blocking gate (oxide layer) 13, and an electrode 14 for a gate are sequentially formed on a semiconductor substrate 10. Word line patterns are then formed by an etch process. In the flash memory cell of the SONOS structure, since the same E-field is applied to the whole complex layer of the blocking oxide layer 13 (i.e., an insulating layer), the charge trap layer 12 for storing charges and the tunnel oxide layer 11, different electric field (E-field) cannot be applied to the insulating layers, respectively.

In this case, if a voltage is applied to the electrode 14 for gate in order to erase the charges stored in the charge trap layer 12, the charges stored in the nitride layer 12 are moved toward the semiconductor substrate 10 by means of a Fowler-Nordheim (F—N) tunneling current through the tunnel oxide layer 11 and are then erased.

As the cell size of a memory cell is reduced, it becomes difficult to separate charges trapped at the source region 15 and the drain region 16 in the cell of the SONOS structure. If the density of charges is increased in order to implement a multi-level, the interference phenomenon becomes more profound, which leads to limit the level of integration.

SUMMARY OF THE INVENTION

Accordingly, the invention addresses the above problems, and provides a non-volatile memory device having a SONOS structure, in which a charge trap layer in which charges are trapped toward source and drain is separated physically in order to prevent charges at both sides of the charge trap layer from being moved mutually, and interference between the charges at both sides can be prevented although the cell size is reduced, and a method of manufacturing the same.

According to one aspect, the invention provides a non-volatile memory device, including a gate in which a gate insulating layer, a charge trap layer, a blocking oxide layer and a gate electrode are formed, respectively over a semiconductor substrate. The charge trap layer is physically divided by a buffer layer.

According to another embodiment, the invention provides a method of manufacturing a non-volatile memory device, including the steps of depositing a gate insulating layer, a buffer layer, a blocking oxide layer and a gate electrode over a semiconductor substrate, respectively, etching the gate electrode, the blocking oxide layer, the buffer layer and the gate insulating layer to form a gate, performing an ion implant process to form source and drain regions within the semiconductor substrate, selectively forming a recessed pattern of the buffer layer by selectively etching the buffer layer both sides, and forming a. charge trap layer in the recessed pattern of the buffer layer.

DETAILED DESCRIPTION OF EMBODIMENTS

Hereinafter, specific embodiments of the invention will be described with reference to the accompanying drawings.

FIGS. 2 to 5 are cross-sectional Views illustrating a method of manufacturing a non-volatile memory device having a SONOS structure according to an embodiment of the invention.

Figure 1:
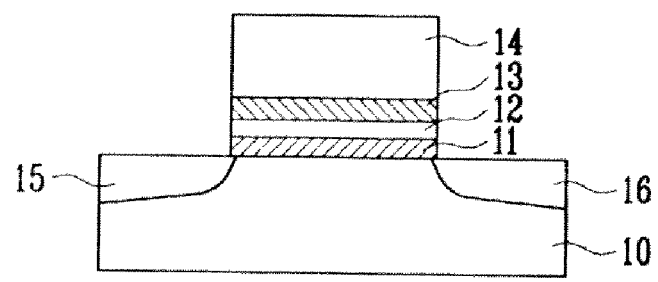
FIG. 1 is a cross-sectional view of a conventional flash memory device having 10 the SONOS structure.
Figure 2:
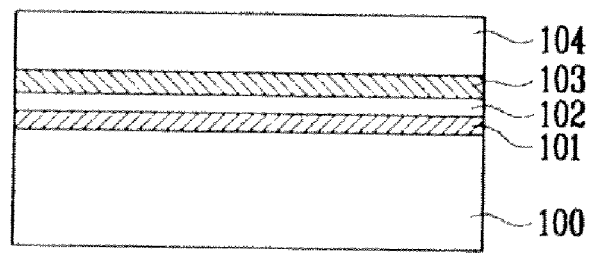
FIGS. 2 to 5 are cross-sectional views illustrating a method of manufacturing a semiconductor memory device having a SONOS structure according to an embodiment of the invention.

Referring to FIG. 2, a gate insulating layer 101, a buffer layer 102, a blocking oxide layer 103 and a gate electrode 104 are sequentially formed on a semiconductor substrate 100. The buffer layer 102 may be formed using a silicon oxide layer or a silicon nitride layer. The blocking oxide layer 103 may be formed using a high dielectric layer, such as $Al_2O_3$, $HfO_2$, $Ta_2O_5$, $ZrO_2$, $La_2O_3$ or $TiO_2$, or a combination of them. Furthermore, a silicon oxide layer may be used instead of the blocking oxide layer 103. The gate electrode 104 may be formed using polysilicon doped with an impurity. The gate electrode 104 may be formed using transfer metal nitride such as TiN, TaN, TiCN, TaCN, TiSiN, TaSiN, WN or RuTiN. The buffer layer 102 is preferably formed to a thickness of 20 Å to 1000 Å.

Figure 3:
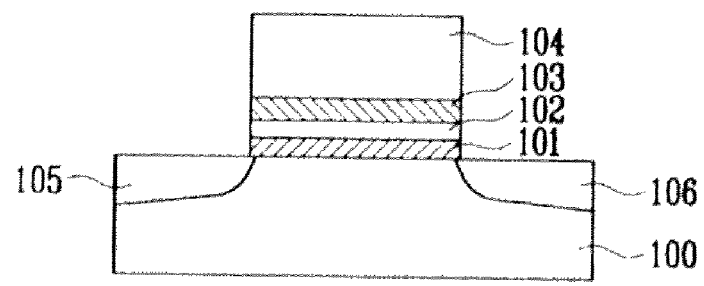

Referring to FIG. 3, the gate electrode 104, the blocking oxide layer 103, the buffer layer 102 and the gate insulating layer 101 are sequentially partially etched by an etch process, forming a gate pattern. An ion implant process is performed to form a source region 105 and a drain region 106 in the exposed semiconductor substrate 100.

Figure 4:
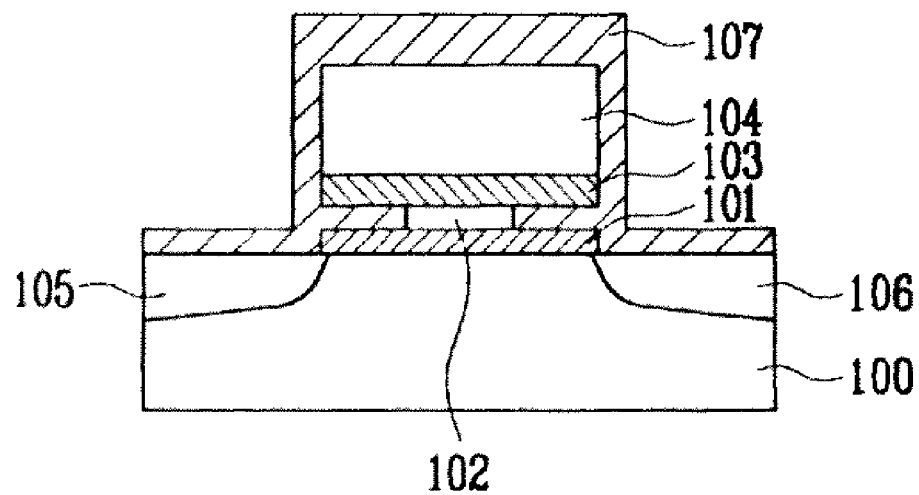

Referring to FIG. 4, an etch process is performed to recess the sides of the exposed buffer layer 102, thus forming a space. It is preferred that the recessed depth be 1/20 to 1/2 or less of the length of a gate pattern.

A charge trap layer 107 is then deposited on the entire surface. The charge trap layer 107 is preferably formed to completely gap fill the empty space formed by etching the buffer layer 102. Furthermore, the charge trap layer 107 may be formed using a silicon nitride layer or metal oxide layer.

The process of forming the source region 105 and the drain region 106 may be carried out posterior to the process of depositing the charge trap layer 107.

Figure 5:
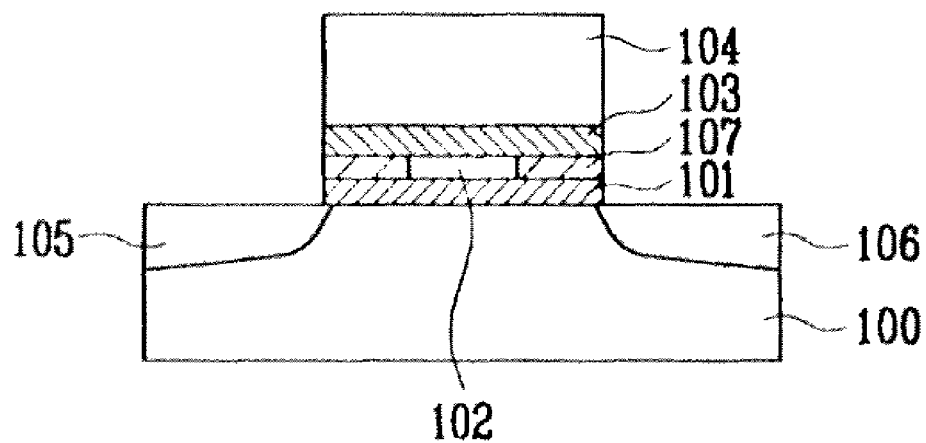

Referring to FIG. 5, an etch process is performed in such a manner that the charge trap layer 107 remains only at both sides of the buffer layer 102. That is, it is preferred that the charge trap layer 107 be physically separated by the buffer layer 102. Due to this, the charge trap layer 107 that traps electric charges is divided into two horizontally at both sides of the gate due to a layer having a physically different property, i.e. the buffer layer 102.

The process of forming the source region 105 and the drain region 106 may be performed posterior to the process of etching the charge trap layer 107.

In accordance with the invention, the charge trap layer that traps electric charges toward the source and drain is physically divided. It can fundamentally prevent the charges at both sides from being moved mutually. It is therefore possible to prevent interference between charges at both sides although the cell size is reduced.

Although the foregoing description has been made with reference to various embodiments, changes and modifications may be made by those skilled in the art without departing from the spirit and scope of the invention.

The invention claimed is:

1. A method of manufacturing a non-volatile memory device comprising the steps of:
   depositing a gate insulating layer, a buffer layer, a blocking oxide layer, and a gate electrode over a semiconductor substrate, respectively;
   etching the gate electrode, the blocking oxide layer, the buffer layer and the gate insulating layer to form a gate;
   performing an ion implant process to form source and drain regions within the semiconductor substrate;
   selectively forming a recessed pattern of the buffer layer by selectively etching the buffer layer both sides;
   depositing a charge trap material over the recessed pattern of the buffer layer, the gate, and the semiconductor substrate; and
   etching the charge trap material to allow the charge trap material to remain only at both sides of the buffer layer.

2. The method of claim 1, comprising forming the buffer layer using a silicon oxide layer or a silicon nitride layer.

3. The method of claim 1, comprising forming the buffer layer to a thickness of 20 to 1000 Å.

4. The method of claim 1, comprising forming the blocking oxide layer using a high dielectric layer.

5. The method of claim 4, wherein the high dielectric layer is selected from the group consisting of $Al_2O_3$, $HfO_2$, $Ta_2O_5$, $ZrO_2$, $La_2O_3$, $TiO_2$ and combinations therein.

6. The method of claim 1, wherein in the selective etch process, the recessed thickness of each of both sides of the buffer layer is set to 1/20 to 1/2 of the gate width.

7. The method of claim 1, comprising forming the gate electrode using transfer metal nitride or polysilicon doped with an impurity.

8. The method of claim 7, wherein the transfer metal nitride is TiN, TaN, TiCN, TaCN, TiSiN, TaSiN, WN or RuTiN.

9. The method of claim 1, comprising forming the ion implant process after the step of depositing the charge trap material or the step of forming the charge trap layer.

* * * * *